(12) United States Patent
Rajasekhar (10) Patent No.: US 9,065,463 B2
(45) Date of Patent: Jun. 23, 2015

(54) METHOD AND APPARATUS FOR REDUCING CAPACITOR INDUCED ISI IN DACS

(71) Applicant: Sanjay Rajasekhar, Bangalore (IN)

(72) Inventor: Sanjay Rajasekhar, Bangalore (IN)

(73) Assignee: ANALOG DEVICES GLOBAL, Hamilton (BM)

( * ) Notice: Subject to any disclaimer, the term of this patent is extended or adjusted under 35 U.S.C. 154(b) by 44 days.

(21) Appl. No.: 14/052,196

(22) Filed: Oct. 11, 2013

(65) Prior Publication Data

US 2015/0102949 A1 Apr. 16, 2015

(51) Int. Cl.
| | |
|---|---|
| *H03M 1/06* | (2006.01) |
| *H03M 1/08* | (2006.01) |
| *H03M 1/74* | (2006.01) |
| *H03M 1/00* | (2006.01) |
| *H03M 1/78* | (2006.01) |

(52) U.S. Cl.
CPC ............... *H03M 1/08* (2013.01); *H03M 1/747* (2013.01); *H03M 1/00* (2013.01); *H03M 1/785* (2013.01)

(58) Field of Classification Search
CPC ........ H03M 1/00; H03M 1/785; H03M 1/747
USPC .................. 341/118, 144, 453, 154
See application file for complete search history.

(56) References Cited

U.S. PATENT DOCUMENTS

| | | | |
|---|---|---|---|
| 4,551,709 A | 11/1985 | Merchant et al. | |
| 5,574,455 A | 11/1996 | Hori et al. | |
| 6,061,010 A | 5/2000 | Adams et al. | |
| 6,555,996 B2 | 4/2003 | Drori et al. | |
| 6,621,438 B1 * | 9/2003 | Hong ............................ | 341/144 |
| 6,812,879 B2 | 11/2004 | Suwa et al. | |
| 7,079,063 B1 | 7/2006 | Nguyen et al. | |
| 7,256,721 B2 | 8/2007 | Copley | |
| 7,307,568 B1 | 12/2007 | Nguyen | |
| 7,551,028 B1 | 6/2009 | Cyrusian | |
| 8,456,341 B2 | 6/2013 | Hezar et al. | |
| 8,653,999 B1 | 2/2014 | Verlinden | |

OTHER PUBLICATIONS

Kohno et al., "A 350-MS/s 33-V 8-bit CMOS D/A Converter using a Delayed Drivng Scheme," Proceedings of the 1995 IEEE Custom Integrated Circuits Conference, pp. 211-214, May 1995.

(Continued)

*Primary Examiner* — Joseph Lauture
(74) *Attorney, Agent, or Firm* — Kenyon & Kenyon LLP (57) ABSTRACT

A circuit may include a plurality of primary digital-to-analog (DAC) elements for converting a digital input signal into an analog output signal. A control circuit may control each primary DAC element to switch between a first state and a second state based on the digital input signal to provide the analog output signal at an output representing the digital input signal. A plurality of corrective DAC elements may be coupled in parallel to the plurality of primary DAC elements between the control circuit and the output. The plurality of corrective DAC elements may be controlled to mitigate for intersymbol interference (ISI) due to parasitic capacitance in the primary DAC elements. The plurality of corrective DAC elements may not contribute a direct current to the analog output signal.

23 Claims, 6 Drawing Sheets

(56) References Cited

OTHER PUBLICATIONS

Schofield et al., "A 16b 400MS/s DAC with <-80dBc IMD to 300MHz and <-160dBm/Hz Noise Power Spectral Density," 2003 IEEE International Solid-State Circuits Conference (ISSCC 2003) Digest of Technical Papers, pp. 126, 482-490.

Adams et al., "A 113-dB SNR oversampling DAC with segmented noise-shaped scrambling," IEEE J. Solid-State Circuits, pp. 1871-1878, Dec. 1998.

* cited by examiner

METHOD AND APPARATUS FOR REDUCING CAPACITOR INDUCED ISI IN DACS

BACKGROUND

The subject matter of this application is directed to digital-to-analog converters (DACs), and more particularly to mitigating intersymbol interference (ISI) in DACs by accounting for parasitic capacitances in the DAC elements.

DACs receive a digital input signal and provide an analog output signal (e.g., current, voltage or electric charge) representing the digital signal. The DAC (e.g., a fully decoded DAC or a thermometric DAC) may include multiple unit elements providing a current or voltage to a DAC output. In one design, the unit elements may include active current sources which are controlled by the switches to provide a current at the output. In another design, the unit elements may include resistors connected to a reference voltage to generate the currents at the output. Depending on the value of the digital input signal, switches are operated to control the contribution of each unit element to provide an output current. The outputs of the unit elements are combined to provide an analog output signal representing the digital input signal.

As the switches are turned on or off, the parasitic capacitances associated with the elements may draw charge from the outputs (e.g., virtual ground nodes of the subsequent amplifying stage). Because in each clock cycle different unit elements may be activated and deactivated to provide the analog output signal corresponding to the digital input signal, the amount of charge drawn from the outputs may vary based on the change in the unit element states. The changes in the charge may draw a code dependent charge at the DAC output. The additional charge at the output may be the source for intersymbol interference (ISI), which is a form of distortion when error is dependent on the present code and previous codes.

BRIEF DESCRIPTION OF THE DRAWINGS

So that features of the present invention can be understood, a number of drawings are described below. It is to be noted, however, that the appended drawings illustrate only particular embodiments of the disclosure and are therefore not to be considered limiting of its scope, for the invention may encompass other equally effective embodiments.

DETAILED DESCRIPTION

Embodiments of the present disclosure may relate to a method to mitigate for intersymbol interference (ISI) due to parasitic capacitance in digital-to-analog (DAC) elements. A circuit according to an embodiment of the present disclosure may include a plurality of primary DAC elements for converting a digital input signal into an analog output signal. A control circuit may control each primary DAC element to switch between a first state and a second state based on the digital input signal to provide the analog output signal at an output representing the digital input signal. A plurality of corrective DAC elements may be coupled in parallel to the plurality of primary DAC elements between the control circuit and the output. The plurality of corrective DAC elements may be controlled to mitigate for ISI due to parasitic capacitance in the primary DAC elements. The plurality of corrective DAC elements may be configured such that they do not contribute a direct current to the analog output signal.

In one embodiment, the control circuit may control each of the corrective DAC elements to change between the first state and the second state such that a charge drawn from the outputs by parasitic capacitances of the main and corrective DAC elements is constant. In another embodiment, the control circuit may control each of the corrective DAC elements to switch between the first state and the second state such that a total number of the primary and corrective DAC elements transitioning between the first and second states is constant in each cycle.

Figure 1:
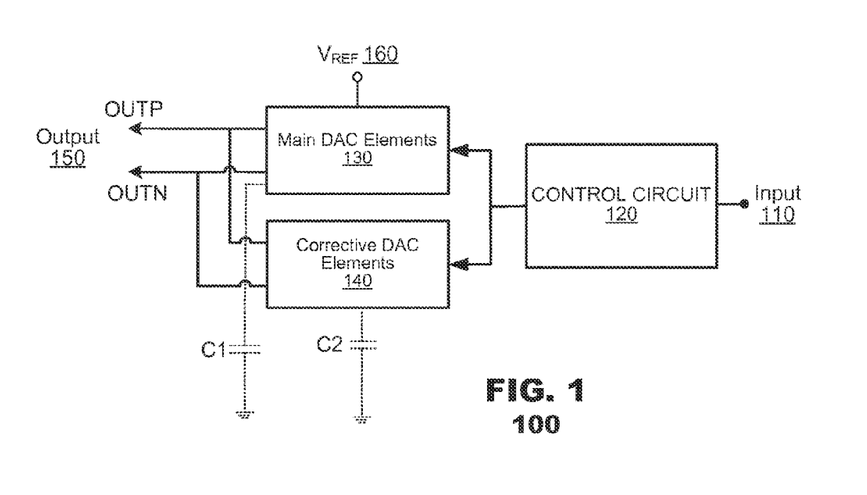
FIG. 1 illustrates a block diagram of a DAC according to an embodiment of the present invention.

FIG. 1 illustrates a block diagram of a DAC 100 according to an embodiment of the present invention. The DAC 100 may include a control circuit 120, main DAC elements 130 and corrective DAC elements 140. The DAC 100 may provide an analog output signal 150 corresponding to a digital input signal 110. The corrective DAC elements 140 may be coupled in parallel to the main DAC elements 130 between the control circuit 120 and the output 150, corrective DAC The control circuit 120 may control the operation of the main DAC elements 130 based on a decoded digital input signal 110. The outputs of each of the main DAC elements 130 may be combined (e.g., via an adder) to provide the analog output signal 150. The output signal 150 may be a differential output signal (OUTP and OUTN).

The control circuit 120 may also control the operation of the corrective DAC elements 140 based the state of the main DAC elements 130 or based on the decoded digital input signal 110. The corrective DAC elements 140 may be controlled such that the charge drawn from the outputs 150 by the total parasitic capacitance at the output 150 is approximately the same regardless of the state of the main DAC elements 130. Regardless of the state of the corrective DAC elements 140, the corrective DAC elements 140 may not provide direct current to the output 150. As will be discussed in more detail below, the corrective DAC elements 140 may still draw a charge at the output 150 due to the parasitic capacitance C2 in the corrective DAC elements 140.

A reference voltage $V_{REF}$ 160 may be coupled to the main DAC elements 130. The reference voltage $V_{REF}$ 160 may be used by the main DAC elements 130 to provide a current to the output 150 based on the control signals received from the control circuit 120.

During operation parasitic capacitances C1, C2 (shown in phantom) may be present in the main DAC elements 130 and the corrective DAC elements 140. The parasitic capacitances C1, C2 may represent the parasitic capacitance of one or more unit elements in the main DAC elements 130 and/or the corrective DAC elements 140. While different components in the DAC elements may contribute to the parasitic capacitance, the main source of the parasitic capacitance may be the switches in the DAC elements. As the switches are controlled to provide the different states of the DAC elements, the parasitic capacitance in the DAC elements may change.

The parasitic capacitances C1, C2 may degrade the performance of the DAC 100 and the circuit including the DAC 100.

As the parasitic capacitances C1, C2 depend on the state of the DAC elements, the parasitic capacitance C1 may draw code dependent charge during switching of the main DAC elements 130.

To mitigate for the parasitic capacitance C1 degrading the performance of the DAC 100 (e.g., drawing code dependent currents), the corrective DAC elements 140 may be included in parallel to the main DAC elements 130. The corrective DAC elements 140 may be an approximate replica of the main DAC elements 130. In one embodiment, only the switches of the main DAC elements 130 are replicated in the corrective DAC elements 140. Thus, each switching circuit in the main DAC elements 130 may include a complementary switching circuit in the corrective DAC element 140. The reference voltage $V_{REF}$ 160 may not be provided to the corrective DAC elements HO. Thus, the corrective DAC elements 140 may not include real current elements (not shown in FIG. 1) contributing direct current to the output 150. The corrective DAC elements 140 may still contribute code dependent currents to the output 160 due to the parasitic capacitance of the corrective DAC elements 140.

In another embodiment, all circuit components in the main DAC elements 130 that may contribute parasitic capacitances may be replicated in the corrective DAC elements 110 to mimic the parasitic capacitances in the main DAC elements 130. For example, resistor and/or current sources in the main DAC elements 130 may be replicated in the corrective DAC elements 140. The current sources in the corrective DAC elements 140 may be "dummy" current sources (e.g., OFF MOS devices). The resistors in the corrective DAC elements 140 may be "dummy" resistors (e.g., having both terminals shorted to each other.

In operation, the control circuit 120 may control the main and corrective DAC elements such that the charge drawn from the outputs 150 by the parasitic capacitances C1, C2 remain constant regardless of the state of the main DAC elements 130. In one embodiment, to maintain constant parasitic capacitances C1, C2, the number of elements in the main DAC elements 130 and the corrective DAC elements 140 that change in each cycle may remain constant. For example, while k elements out of a total of N elements in the main DAC elements 130 change in a clock cycle, N-k elements in the corrective DAC elements 140 may also be changed. That is, during any cycle a total of N elements change their state. Thus, the total charge drawn due the parasitic capacitances C1, C2 may remain approximately constant regardless of which DAC elements are activated in the main DAC elements 130 and the corrective DAC elements 140. It may not matter whether the elements change from an "on state" to an "off state" or from an "off state" to an "on state".

In another embodiment, each pair of complementary elements in the main DAC elements 130 and the corrective DAC elements 140 may have a different state. For example, while an element in the main DAC elements 130 is in a first state (e.g., on state), a complimentary element in the corrective DAC elements 140 may be in a second state (e.g., off state). Therefore, during each cycle N number of elements may be in the first state and N number of elements may be in the second state. Thus, the total charge drawn due the parasitic capacitances C1, C2 may remain approximately constant regardless of the number of elements changing states in the main DAC elements to provide the needed analog output signal 150.

In one embodiment, the first state may include the main DAC elements 130 providing a positive current to the output 150 and the second state may include the main DAC elements 130 providing no current to the output 150. In another embodiment, the first state may include the main DAC elements 130 providing a positive current to the output 150, and the second state may include the main DAC elements 130 providing a negative current to the output 150. Because the corrective DAC elements 140 do not contribute direct current to the output 150, the first and second states of the corrective DAC elements 140 may be provided by mimicking that states of the switches in the main DAC elements 130.

Figure 2:
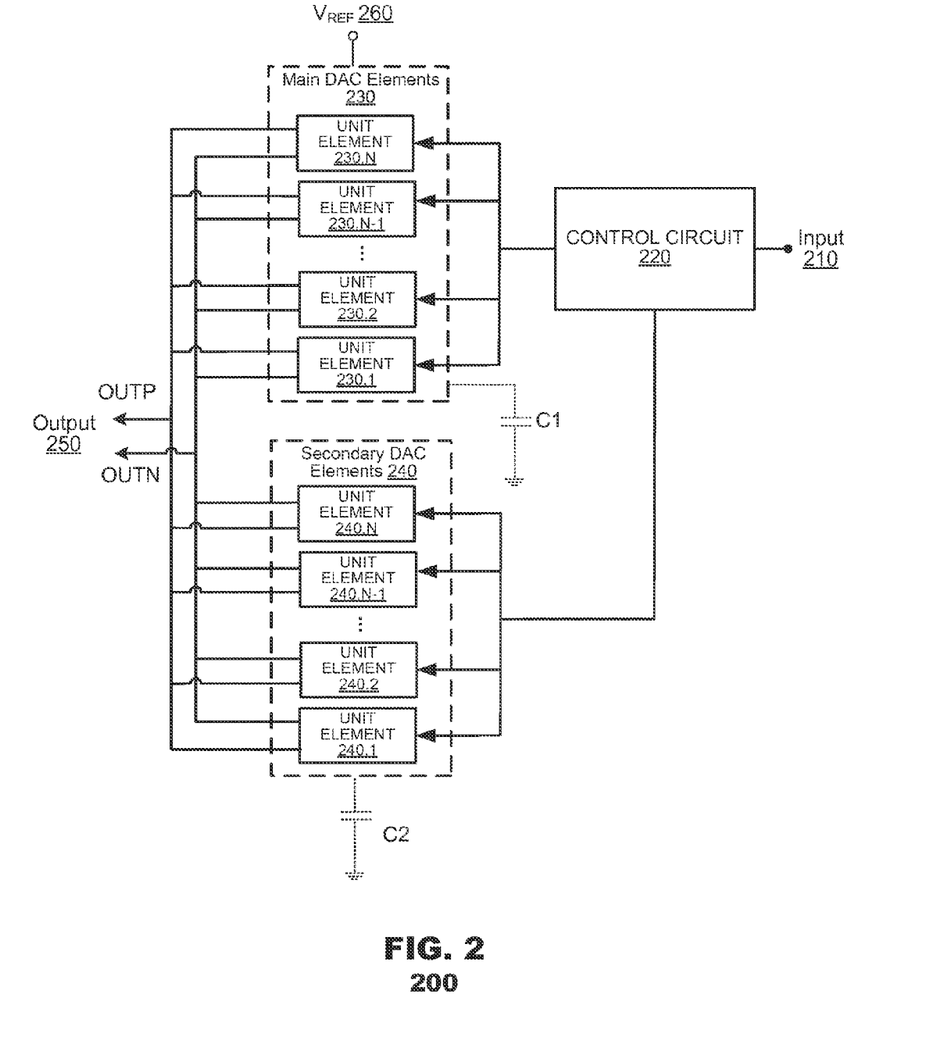
FIG. 2 illustrates a thermometric DAC circuit according to an embodiment of the present invention.

FIG. 2 illustrates a thermometric DAC circuit 200 according to an embodiment of the present invention. The DAC 200 may include a control circuit 220, main DAC elements 230 and corrective DAC elements 240. A reference voltage $V_{REF}$ 260 may be coupled to the main DAC elements 230. The thermometric DAC circuit 200 may be used to drive an amplifier (e.g., the operational amplifier 522 shown in FIG. 5).

The control circuit 220 may decode a digital input signal 210 and provide control signals to control the operation of the main DAC elements 230 and the corrective DAC elements 240. The outputs of each of the main DAC elements 230 may be combined (e.g., via an adder) to provide an analog output signal 250. The output signal 250 may be a differential output signal including OUTP and OUTN.

The reference voltage $V_{REF}$ 260 may be used by each of the main DAC elements 230 to provide a current to the output 250 based on the control signals received from the control circuit 220. In another embodiment, each of the main DAC elements 230 may include one or more current sources (not shown in FIG. 2). The current sources may be controlled to provide a current to the output 250 based on the control signals received from the control circuit 220.

The main DAC elements 230 may include a plurality of unit elements 230.1-N. The corrective DAC elements 240 may include a plurality of unit elements 240.1-N. Each unit elements 230.1-N in the main DAC elements 230 may have a matching corresponding unit element 240.1-N in the corrective DAC elements 240. Various layout techniques may be used to match the characteristics (e.g., parasitic capacitance) of the complementary unit elements in the main DAC elements 230 and the corrective DAC elements 240. In one embodiment, only the switches of the main DAC elements 230.1-N are replicated in the corrective DAC elements 240.1-N. In another embodiment, all of the components (e.g., current sources and/or resistors) in the main DAC elements 230.1-N that may contribute to the parasitic capacitance are replicated in the corrective DAC elements 240.1-N.

The plurality of unit elements 230.1-N may be identical unit elements (e.g., two-level current steering unit elements providing a positive state and an inert state at the outputs or providing a positive state and a negative state at the outputs). Alternatively, the plurality of unit elements 230.1-N may be weighted cells, where each of the weighted cells 230.1-N may provide a different current value. In another embodiment, a hybrid system may include both identical unit elements and weighted cells. In a hybrid system, the most significant bits may be provided to the identical unit elements and the least significant bits may be provided to the weighted cells.

As discussed above, each unit element may include a parasitic capacitance. Depending on the state of the unit element a different parasitic capacitance may be provided by the unit element. The total parasitic capacitance of the unit elements in each of the main and corrective DAC elements is represented with parasitic capacitors C1, C2, respectively.

Without the corrective DAC elements 240, the DAC 200 may be susceptible to intersymbol interference (ISI) due to code dependent charges being generated by the parasitic capacitance C1 in the main DAC elements 230. The parasitic capacitances C1, C2 may draw code dependent currents when a voltage difference is present between the outputs OUTP and OUTN (e.g., virtual grounds). The voltage difference may develop due to the outputs OUTP and OUTN being coupled to an integrator amplifier (e.g., operational amplifier 522 shown in FIG. 5) having a finite bandwidth. As the unit elements having the parasitic capacitance change their state and their connection between the outputs OUTP and OUTN, the unit elements may draw a code dependent charge proportional to the value of the parasitic capacitance and a difference in voltage at the outputs OUTP and OUTN. This code dependent charge due to the parasitic capacitance may cause distortion and quantization noise in the circuits.

During operation, based on the digital input signal 210, k number of elements in the main DAC elements 230 may change between a first state (e.g., providing a positive current at the output) and a second state (e.g., providing an inert state or a negative current at the output). Such a change in the state of the elements may draw a charge of $k*C*\Delta V$, where k is the number of elements changing the state, C is the value of the parasitic capacitance of the element, and $\Delta V$ is the voltage difference at the outputs OUTN and OUTP. Because the charge that is drawn may depend on the number of elements changing state, there is non-linearity in the value provided at the output 250.

To correct for the non-linearity, the elements in the corrective DAC elements 240 may be controlled to keep the number of elements changing states in the main DAC elements 230 and in the corrective DAC elements 240 constant. For example, if k elements in the main DAC elements 230 change state in a particular cycle, N-k elements may change state in the corrective DAC elements 240. Thus, regardless of the digital input signal 210, the total charge drawn due to the parasitic capacitance may be $(k+N-k)*C*\Delta V=N*C*\Delta V$. The analog signal at the output 250 may correspond to the digital signal at the input 210 because only the main DAC elements 230 contribute a direct current to the output 250 while the corrective DAC elements 240 do not contribute a direct current to the output 250. The secondary unit elements 240 may only contribute a charge due to the parasitic capacitance in the corrective DAC elements 240.

In another embodiment (not shown in FIGS. 1 and 2), separate control circuits may be used to control the main DAC elements 230 and the corrective DAC elements 240.

The DACs in FIGS. 1 and 2 may include other components not illustrated in these figures such as power sources and other components for reducing EMI. Shuffling may be performed on the main DAC elements 230 and/or the corrective DAC elements 240 for linearity.

Figure 3:
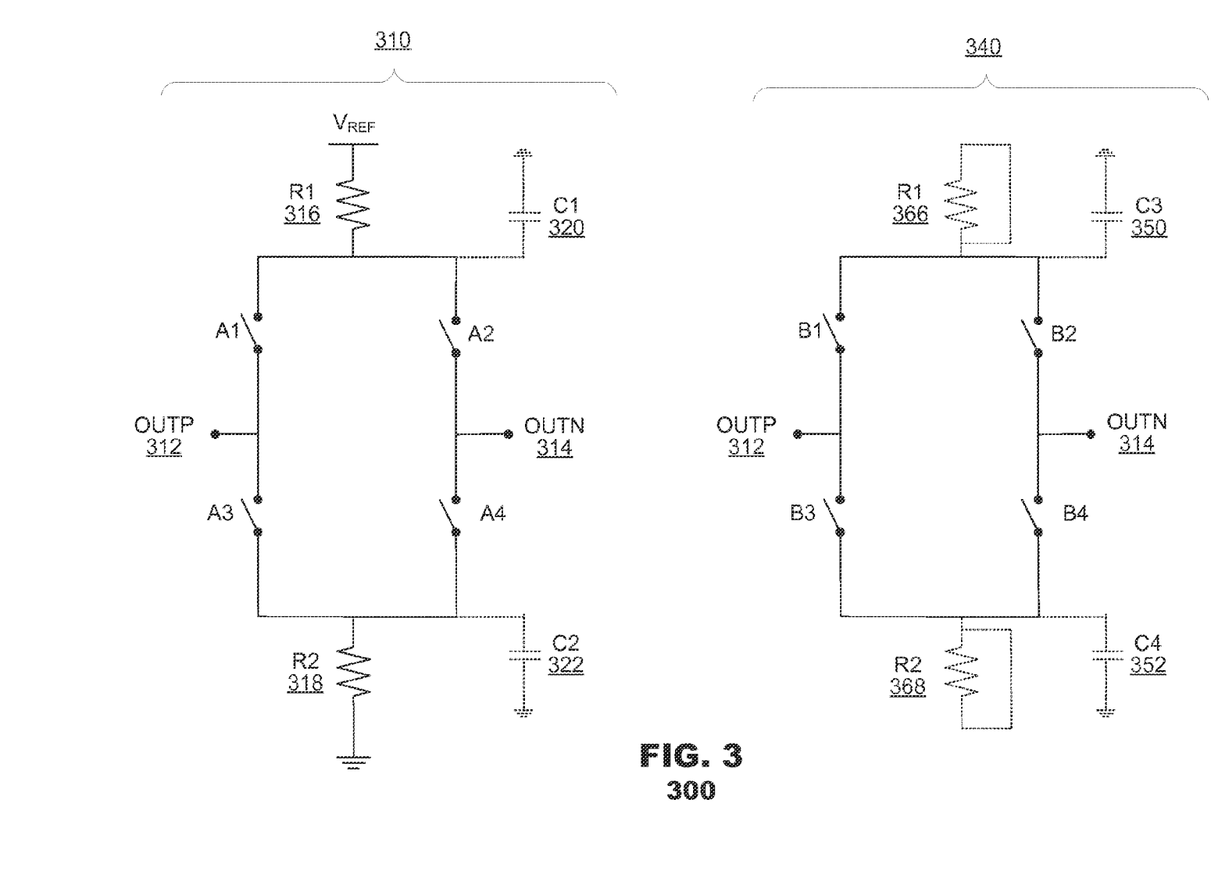
FIG. 3 illustrates a resistive DAC circuit according to an embodiment of the present invention.

FIG. 3 illustrates a resistive DAC circuit 300 according to an embodiment of the present invention. The resistive DAC circuit 300 may include a main DAC circuit 310 and a corrective DAC circuit 340. The main DAC circuit 310 may include a plurality of switches A1, A2, A3, and A4, a pair of output terminals 312 and 314, and a pair of resistors 316 and 318. The corrective DAC circuit 340 may include a plurality of switches B1, B2, B3, and B4, and the pair of output terminals 312 and 314. The main DAC circuit 310 may correspond to one of the unit elements in the main DAC elements 130 (shown in FIG. 1) or to one of the unit elements in the main DAC elements 230 (shown in FIG. 2). The corrective DAC circuit 340 may correspond to one of the unit elements in the corrective DAC elements 140 (shown in FIG. 1) or to one of the unit elements in the corrective DAC elements 240 (shown in FIG. 2). In another embodiment, the main DAC circuit 310 and the corrective DAC circuit 340 may be included as one unit element in a DAC.

In the main DAC circuit 310, the plurality of switches A1, A2, A3, and A4 may establish two circuit branches between resistors 316 and 318. Switches A1 and A3 may define a first branch, established between resistor 316, the output OUTP 312, and resistor 318. Switches A2 and A4 may define a second branch, established between resistor 316, the output OUTN 314, and resistor 318. One terminal of the resistor 316 may be coupled to a reference voltage $V_{REF}$ and another terminal of the resistor 316 may be coupled to switches A1 and A2. One terminal of the resistor 318 may be coupled to a second reference voltage (e.g., ground) and another terminal of resistor 316 may be coupled to switches A3 and A4.

In the corrective DAC circuit 340, the plurality of switches B1, B2, B3, and B4 may also establish two branches. Switches B1 and B2 may be coupled in series to define a first branch between the output OUTP 312 and the output OUTN 314. Switches B3 and B4 may be coupled in series to define a second branch between the output OUTP 312 and the output OUTN 314. Parameters of switches B1, B2, B3, and B4 may match the parameters of corresponding switches A1, A2, A3, and A4, respectively, and may be arranged in the same configuration between the outputs OUTP 312 and OUTN 314.

As shown in FIG. 3, parasitic capacitances 320 and 322 may be present in the main DAC circuit 310. The parasitic capacitance 320 may be coupled to the node connecting the resistor 316 and switches A1, A2. The parasitic capacitance 322 may be coupled to the node connecting the resistor 318 and switches A3, A4. The parasitic capacitances 320 and 322 may include parasitic capacitance from one or more switches and resistors in the main DAC circuit 310. During operation, when the outputs OUTP 312 and OUTN 314 are at different voltages, parasitic capacitance 320 and 322 may draw a code dependent charge.

Similarly, parasitic capacitances 350 and 352 may be present in the corrective DAC circuit 340. The parasitic capacitances 350 may be coupled to the node connecting the switches B1 and B2. The parasitic capacitance 352 may be coupled to the node connecting the switches B3 and B4. Parasitic capacitances 350 and 352 may include parasitic capacitance from one or more switches in the circuit. Because the components in the main DAC circuit 310 and the corrective DAC circuit 340 may be similar, parasitic capacitance 320 may be approximately equal to parasitic capacitance 350, and parasitic capacitance 322 may be approximately equal to parasitic capacitance 352.

Control signals may be applied to the switches A1, A2, A3, and A4 to provide current or drain current from the output terminals 312, 314. For example, switches A1 and A4 may be closed and switches A2 and A3 may be open to provide a first state. Switches A2 and A3 may be closed and switches A1 and A4 may be open to provide a second state. During the first state, the resistor 316 may provide current to the output OUTP 312, and the resistor 318 may drain current from the output OUTN 314. During the second state, the resistor 316 may provide current to the output OUTN 314, and the resistor 318 may drain current from the output OUTP 312. The definitions of the states discussed above are discussed with reference to the embodiment shown in FIG. 3, but may be defined differently in other embodiments.

Similarly, control signals may be applied to the switches B1, B2, B3, and 34 to provide a circuit having a first state and a second state that corresponds to the main DAC circuit 310. However, during the first state and the second state the corrective DAC circuit 340 may not provide direct current to the outputs 312 and 314.

To mitigate for ISI due to the parasitic capacitance, the main and corrective DAC circuits may be controlled such that the charge drawn from the outputs 312, 314 by the parasitic capacitances remains constant regardless of the state of the main DAC circuit 310. To maintain the constant charge drawn from the outputs 312, 314 by the parasitic capacitances, the total number of elements (primary and corrective circuits) that change the state every cycle may be constant (i.e. N). That is, both main and corrective DAC circuits 310 and 340 could be in the same state as long as the total number of such elements (e.g., elements in FIG. 2) that change states remains constant.

In another embodiment, the switches in the corrective DAC circuit 340 may be controlled to change their state when the switches in the main DAC circuit 310 are controlled to switch their state. For example, when switches A1 and A4 are controlled to open, switches B1 and B4 may be controlled to dose. Similarly, when switches A2 and A3 are controlled to close, switches B2 and B3 may be controlled to open. Thus, approximately the same parasitic capacitance may be present at the outputs 312, 314 regardless of the state of the main DAC circuit 310.

In one embodiment, the state of the switches in the main DAC circuit 310 may always be different from the state of the complementary switches in the corrective DAC circuit 340. Table 1 illustrates the possible states of the switches in the main DAC circuit 310 and the corrective DAC circuit 310.

TABLE 1

| | A1 | A2 | A3 | A4 | B1 | B2 | B3 | B4 |
|---|---|---|---|---|---|---|---|---|
| When circuit 310 is in first state | Closed | Open | Open | Closed | Open | Closed | Closed | Open |
| When circuit 310 is in second state | Open | Closed | Closed | Open | Closed | Open | Open | Closed |

Activation of the corresponding switches in the main and corrective DAC circuits 310, 340 may be operated in a complementary fashion. When a switch in one circuit (e.g., switch A1) is closed, the complementary switch (e.g., switch B2) may be open. Thus, during operation one of the parasitic capacitances 320 and 350 is drawing the charge at the outputs 312, 314, and one of the parasitic capacitances 322 and 352 is drawing the charge connected at the outputs 312, 314. Therefore, regardless of the state of the main DAC circuit 310, approximately the same charge is drawn by the parasitic capacitance at the outputs 312, 314.

The plurality of switches A1, A2, A3, and A4 and the plurality of switches B1, B2, B3, and B4 may be implemented as MOS transistors e.g., NMOS, PMOS or low voltage NMOS). In another embodiment, the resistors 316, 318 may be replaced with current sources.

As shown in FIG. 3, the corrective DAC circuit 340 may include corrective resistors 366 and 368. The corrective resistor 366 may correspond to the resistor 316 in the main DAC circuit 310 and the corrective resistor 368 may correspond to the resistor 318 in the main DAC circuit 310. The corrective resistors 366 and 368 may be included if the resistors 316 and 318 contribute to the parasitic capacitances 320, 322. The terminals of the corrective resistor 366 may be shorted to each other and the terminals of the corrective resistor 368 may be shorted to each other.

Figure 4:
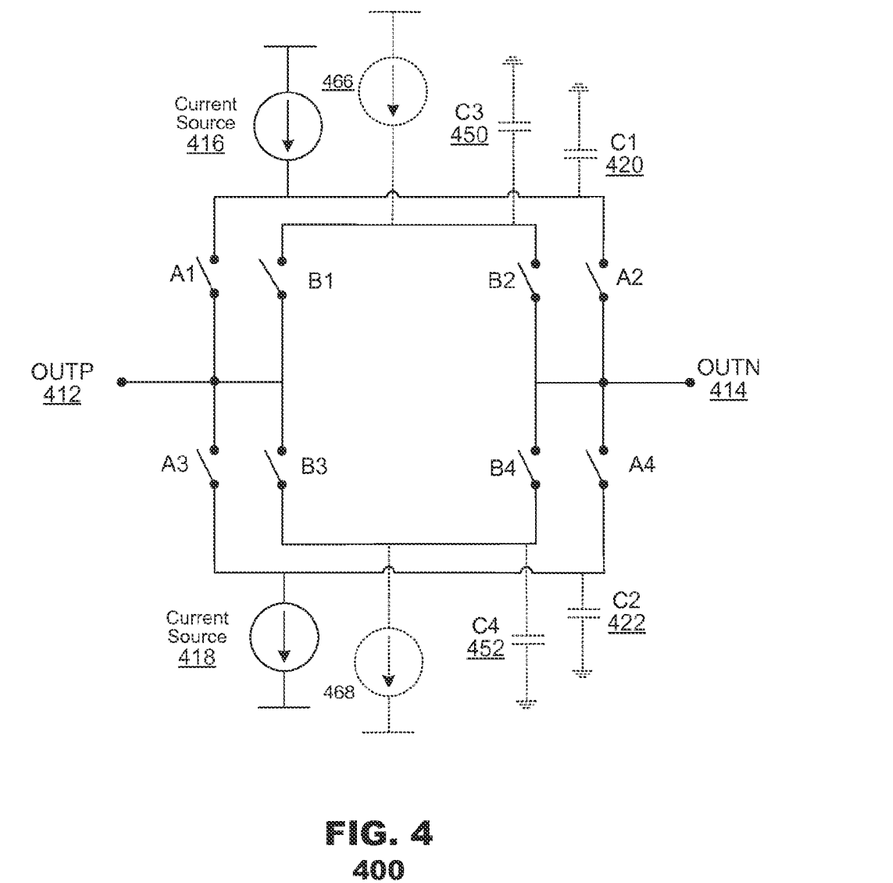
FIG. 4 illustrates a current steering DAC circuit according to an embodiment of the present invention.

FIG. 4 illustrates a current steering DAC circuit 400 according to an embodiment of the present invention. The current steering DAC circuit 400 may include a first set of switches A1, A2, A3, and A4, a second set of switches B1, B2, B3, and B4, a pair of output terminals 412 and 414, and a pair of current sources 416 and 418. The DAC circuit 400 may correspond to one of the unit elements in the main DAC elements 230 (shown in FIG. 2) and to one of the elements in the corrective DAC elements 240 (shown in FIG. 2).

The first set of switches A1, A2, A3 and A4 may establish two circuit branches between a first current source 416 and a second current source 418. Switches A1 and A3 may define a first branch, established between current source 416, the output OUTP 412, and current source 418. Switches A2 and A4 may define a second branch, established between current source 416, the output OUTN 414, and current source 418. The first current source 416 may be coupled to switches A1 and A2. The second current source 118 may be coupled to switches A3 and A4.

The second set of switches B1, B2, B3, and B4 may also establish two branches. Switches B1 and B2 may be coupled in series to define a first branch between the output OUTP 412 and the output OUTN 414. Switches B3 and B4 may be coupled in series to define a second branch between the output OUTP 412 and the output OUTN 414. Parameters of switches B1, B2, B3, and B4 may match the parameters of corresponding switches A1, A2, A3, and A4, respectively, and may be arranged in the same configuration between the outputs OUTP 412 and OUTN 414.

As shown in FIG. 4, parasitic capacitances 420 and 422 may be present in the branches formed by the first set of switches A1, A2, A3, and A4. The parasitic capacitance 420 may be coupled to the node connecting the first current source 416 and switches A1, A2. The parasitic capacitance 422 may be coupled to the node connecting the second current source 418 and switches A3, A4. The parasitic capacitances 420 and 422 may include parasitic capacitances from one or more switches and resistors in the branches formed by the first set of switches A1, A2, A3, and A4. During operation, when the outputs OUTP 412 and OUTN 414 are at different voltages, parasitic capacitance 120 and 422 may draw a code dependent charge.

Similarly, parasitic capacitances 450 and 452 may be present in the branches formed by the second set of switches B1, B2, B3, and B4. The parasitic capacitance 450 may be coupled to the node connecting the switches B1 and B2. The parasitic capacitance 452 may be coupled to the node connecting the switches B3 and B1. Parasitic capacitances 450 and 452 may include parasitic capacitances from one or more switches in the circuit. Because the components in the branches formed by the first set of switches A1, A2, A3, and A4 may be similar to the components in the branches formed by the second set of switches B1, B2, B3, and B4, parasitic capacitance 420 may be approximately equal to parasitic capacitance 450, and parasitic capacitance 422 may be approximately equal to parasitic capacitance 452.

Control signals may be applied to the switches A1, A2, A3, and A4 to provide current to or drain current from the output terminals 412, 414. For example, switches A1 and A4 may be closed and switches A2 and A3 may be open to provide a first state. Switches A2 and A3 may be closed and switches A1 and A4 may be open to provide a second state. During the first state, the first current source 416 may provide current to the output OUTP 412 and the second current source 418 may drain current from the output OUTN 414. During the second state, the first current source 416 may provide current to the output OUTN 414 and the second current source 418 may drain current from the output OUTP 412. The definitions of the states discussed above are discussed with reference to the embodiment shown in FIG. 4, but may be defined differently in other embodiments.

To mitigate for ISI due to the parasitic capacitances, the DAC circuit 400 may be controlled such that the charge drawn from the outputs 412, 414 by the parasitic capacitances remains constant regardless of the state of the DAC circuit 400. To maintain the constant charge drawn from the outputs 412, 414 by the parasitic capacitances, the total number of elements (primary and corrective circuits) that change the state every cycle may be constant (i.e. N).

In one embodiment, while the first set of switches A1, A2, A3, and A4 are controlled to provide current or drain current from the output terminals 412, 414, the second set of switches B1, B2, B3, and B4 may be controlled to ensure that the parasitic capacitance remains approximately the same regardless of the DAC circuit 400 state, Because the current sources 416 and 418 are not connected to the branches formed by the second set of switches B1, B2, B3, and B4, these branches may not provide direct current to the outputs 412 and 414. Providing approximately the same parasitic capacitance in the DAC circuit 400 regardless of the state of the circuit may help to mitigate for ISI due to the parasitic capacitance.

Table 2 illustrates the possible states of the first and second set of switches in the first state and the second state of the DAC circuit 400.

TABLE 2

|  | A1 | A2 | A3 | A4 | B1 | B2 | B3 | B4 |
|---|---|---|---|---|---|---|---|---|
| First State | Closed | Open | Open | Closed | Open | Closed | Closed | Open |
| Second State | Open | Closed | Closed | Open | Closed | Open | Open | Closed |

Activation of the corresponding switches in the first and second set of switches may be operated in complementary fashion. When a switch in the first set of switches (e.g., switch A1) is closed, the complementary switch in the second set of switches (e.g., switch B2) may be open. Thus, during operation one of the parasitic capacitances 420 and 450 is drawing the charge at the outputs 412, 414, and one of the parasitic capacitances 422 and 452 is drawing the charge at the outputs 412, 414. Therefore, regardless of the state of the main DAC circuit 400, approximately the same charge is drawn by the parasitic capacitance at the outputs 412, 414.

The first set of switches A1, A2, A3 and A4 and the second set of switches 31, 62, B3 and B4 may be implemented as MOS transistors (e.g., NMOS, PMOS or low voltage NMOS). In another embodiment, the current sources 416, 418 may be replaced with resistors and voltage sources.

As shown in FIG. 4, the corrective DAC circuit 440 may include dummy current sources 466 and 468. The dummy current source 466 may correspond to the current source 416 in the main DAC circuit 410 and the dummy current source 468 may correspond to the current source 418 in the main DAC circuit 410. The dummy current sources 466 and 468 may be included if the current sources 416, 418 contribute to the parasitic capacitances 420, 422. The dummy current sources 466 and 468 may be OFF MOS devices.

Figure 5:
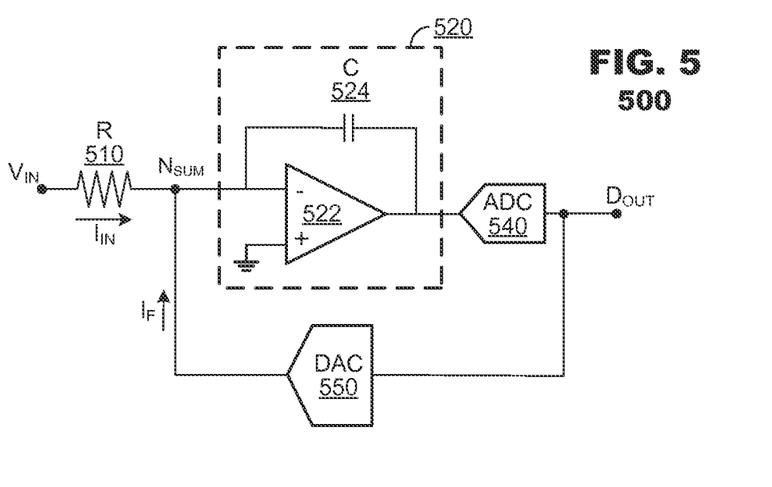
FIG. 5 illustrates a block diagram of a continuous-time delta-sigma modulator (CTDSM) including an analog-to-digital converter (ADC) according to an embodiment of the present invention.

FIG. 5 illustrates a block diagram of a continuous-time delta-sigma modulator (CTDSM) 500 including an ADC according to an embodiment of the present invention. The CTDSM may include an input resistor 510, an integrator 520, an analog to digital converter (ADC) 540, and a DAC 550. The CTDSM 500 may receive an analog input signal $V_{IN}$ and provide a digital output signal $D_{OUT}$ corresponding to the analog input signal $V_{IN}$.

An input signal $V_{IN}$ may be provided to a first terminal of the input resistor 510, and a second terminal of the input resistor 510 may be coupled to an input terminal of the integrator 520. An output terminal of the integrator 520 may be coupled to an input terminal of the ADC 540 and an output terminal of the ADC 540 may provide an output signal $D_{OUT}$ of the CTDSM 500. The output terminal of the ADC 540 may also be coupled to an input terminal of the DAC 550, and an output terminal of the DAC 550 may be coupled to the integrator 520 via a summing node $N_{SUM}$.

The input signal $V_{IN}$ may be an analog input signal, which may vary continually over time. The input signal $V_{IN}$ may be a single-ended signal or a differential signal. The input signal $V_{IN}$ may be applied to the input resistor 510 to provide an input current $I_{IN}$ corresponding to the input signal $V_{IN}$. The integrator 520 may receive the input current $I_{IN}$ and an analog-converted feedback signal $I_F$ from the DAC 550, and integrate a sum of the input current $I_{IN}$ and the feedback signal $I_F$. As shown in FIG. 5, the integrator 520 may include an active RC configuration including an operational amplifier 522 and capacitor 524.

The ADC 540 may convert the output of the integrator 520 into a digital output $D_{OUT}$. The DAC 550 may receive the digital output signal $D_{OUT}$ and convert the digital output signal $D_{OUT}$ into an analog feedback signal $I_F$. The analog feedback signal $I_F$ may be summed with the input current $I_{IN}$ at the summing node $N_{SUM}$, and the summed signal may be provided to the integrator 520. The DAC 550 may correspond to one of the DAC circuits discussed above.

Figure 6A:
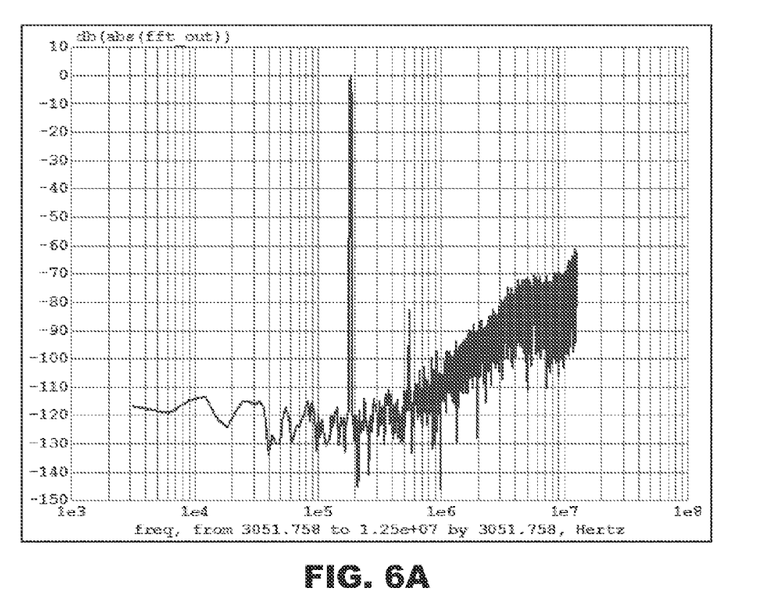
FIGS. 6A and 6B illustrate output spectrums for a continuous-time delta-sigma modulator (CTDSM).
Figure 6B:
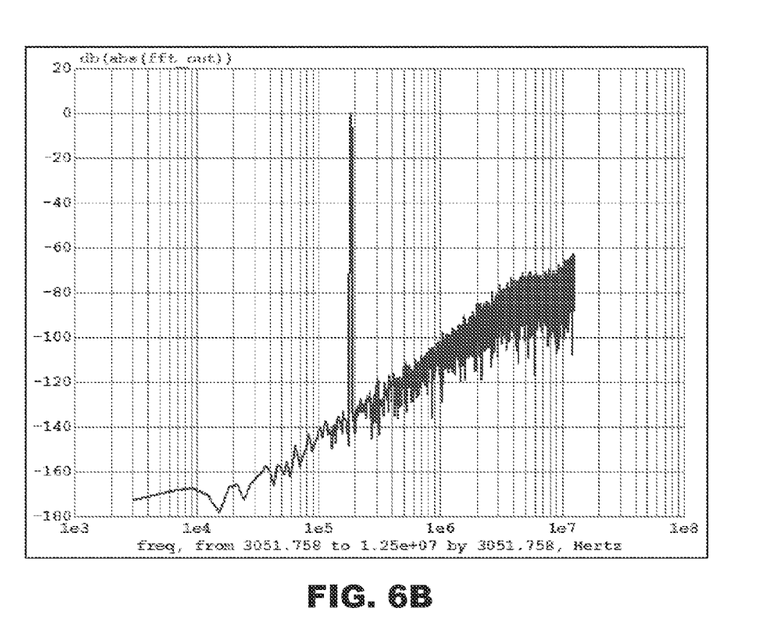

FIG. 6A illustrates an output spectrum for a CTDSM without a correction DAC circuit, and FIG. 6B illustrates an output spectrum for a CTDSM including a correction DAC circuit. As shown FIG. 6A, the output spectrum of the circuit without a correction DAC circuit may include large harmonics and an increase of quantization noise. As shown in FIG. 6B, including a correction DAC circuit in the CTDSM reduces the harmonics and quantization noise.

FIG. 5 illustrate a first-order CTDSM for illustration purposes only, and the embodiments of the present invention may be provided with other architectures of CTDSMs (e.g., higher order CTDSMs) or may be provided with a discrete time delta-signal modulators (DTDSMs).

The above discussed embodiments to mitigate ISI due to parasitic capacitance may be applied on other circuits. For example, embodiments discussed above may be applied to circuits having a single output and/or a single current source.

In the above description, for purposes of explanation, numerous specific details have been set forth in order to provide a thorough understanding of the inventive concepts. As part of this description, some structures and devices may have been shown in block diagram form in order to avoid obscuring the invention. Reference in the specification to "one embodiment" or "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

One or a plurality of the above illustrated operations described herein may be implemented in a computer program that may be stored on a storage medium having instructions to program a system to perform the operations. The storage medium may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

As used in any embodiment in the present disclosure, "circuitry" may comprise, for example, singly or in any combination, analog circuitry, digital circuitry, hardwired circuitry, programmable circuitry, state machine circuitry, and/or firmware that stores instructions executed by programmable circuitry. Also, in any embodiment herein, circuitry may be embodied as, and/or form part of, one or more integrated circuits.

It will be appreciated that in the development of any actual implementation (as in any development project), numerous decisions must be made to achieve the developers' specific goals (e.g., compliance with system and business related constraints), and that these goals will vary from one implementation to another. It will also be appreciated that such development efforts might be complex and time consuming, but would nevertheless be a routine undertaking for those of ordinary skill in art having the benefit of this disclosure.

What is claimed is:

1. A circuit comprising:
a plurality of primary digital-to-analog (DAC) elements for converting a digital input signal into an analog output signal;
a control circuit controlling each primary DAC element to switch between a first state and a second state based on the digital input signal to provide the analog output signal representing the digital input signal at an output; and
a plurality of corrective DAC elements coupled in parallel to the plurality of primary DAC elements between the control circuit and the output,
wherein the control circuit controls each of the corrective DAC elements to switch between the first state and the second state such that a charge drawn from the output by parasitic capacitances of the main and corrective DAC elements is substantially constant.

2. The circuit of claim 1, wherein the control circuit controls each of the corrective DAC elements to switch between the first state and the second state such that a total number of the primary and corrective DAC elements transitioning between the first and second states is constant in each cycle.

3. The circuit of claim 1, wherein the corrective DAC elements do not contribute a direct current to the analog output signal.

4. The circuit of claim 1, wherein in the first state the primary DAC elements provide a positive current to the output, and in the second state the primary DAC elements provide a negative current to the output.

5. The circuit of claim 1, wherein the primary DAC elements are resistive DAC elements.

6. The circuit of claim 1, wherein the primary DAC elements are current steering DAC elements.

7. The circuit of claim 1, wherein the output signal is a differential output signal.

8. The circuit of claim 1, wherein the plurality of primary DAC elements are a thermometric DAC.

9. The circuit of claim 1, wherein the control circuit controls a plurality of switches to switch the primary DAC elements between the first state and the second state, and the switches are one of a NMOS switch, a PMOS switch, and a low voltage NMOS switch.

10. A digital-to-analog (DAC) element, comprising:
a first current source;
a second current source;
a first set of switches arranged to form a plurality of primary circuit branches between the first and the second current sources, wherein:
a first of the primary circuit branches includes a first switch connected between the first current source and a first output terminal, and a second switch connected between the second current source and the first output terminal,
a second of the primary circuit branches includes a third switch connected between the first current source and a second output terminal, and a fourth switch connected between the second current source and the second output terminal; and
a second set of switches arranged to form a plurality of corrective circuit branches between the first and the second output terminals, wherein:
a first of the corrective circuit branches includes a fifth switch and a sixth switch connected in series between the first and the second output terminals, and
a second of the corrective circuit branches includes a seventh switch and an eighth switch connected in series between the first and the second output terminals.

11. The DAC element of claim 10, wherein the first set of switches in the primary circuit branches are operated to provide one of two states in each clock cycle, the states including:
a first state in which the first current source provides current to the first output terminal and the second current source drains current from the second output terminal, and
a second state in which the first current source provides current to the second output terminal and the second current source drains current from the first output terminal.

12. The DAC element of claim 11, wherein the second set of switches in the corrective circuit branches are operated to provide one of two states in each clock cycle, the states including:
a first state in which the fifth switch and the eighth switch are closed and the sixth switch and the seventh switch are open, and
a second state in which the fifth switch and the eighth switch are open and the sixth switch and the seventh switch are closed; and
the first set of switches and the second set of switches are controlled such that in each clock cycle when the first set of switches provides the first state the second set of switches provides the second state, and when the first set of switches provides the second state the second set of switches provides the first state.

13. The DAC element of claim 12, wherein the second set of switches in the first and second states do not contribute a direct current to the first and second outputs.

14. The DAC element of claim 10, wherein the switches of at least one of the first and second sets of switches include one of a NMOS switch, a PMOS switch, and a low voltage NMOS switch.

15. A digital-to-analog (DAC) element, comprising:
a first resistor coupled to a first reference voltage;
a second resistor coupled to a second reference voltage;
a first set of switches arranged to form a plurality of primary circuit branches between the first and the second resistors, wherein:
  a first of the primary circuit branches includes a first switch connected between the first resistor and a first output terminal, and a second switch connected between the second resistor and the first output terminal,
  a second of the primary circuit branches includes a third switch connected between the first resistor and a second output terminal, and a fourth switch connected between the second resistor and the second output terminal; and
a second set of switches arranged to form a plurality of corrective circuit branches between the first and the second output terminals, wherein:
  a first of the corrective circuit branches includes a fifth switch and a sixth switch connected in series between the first and the second output terminals, and
  a second of the corrective circuit branches includes a seventh switch and an eighth switch connected in series between the first and the second output terminals.

16. The DAC element of claim 15, wherein the first set of switches in the primary circuit branches are operated to provide one of two states in each clock cycle, the states including:
  a first state in which the first resistor is coupled to the first output terminal and the second resistor is coupled to the second output terminal, and
  a second state in which the first resistor is coupled to the second output terminal and the second resistor is coupled to the first output terminal.

17. The DAC element of claim 16, wherein the second set of switches in the corrective circuit branches are operated to provide one of two states in each clock cycle, the states including:
  a first state in which the fifth switch and the eighth switch are closed and the sixth switch and the seventh switch are open, and
  a second state in which the fifth switch and the eighth switch are open and the sixth switch and the seventh switch are closed; and
the first set of switches and the second set of switches are controlled such that in each clock cycle when the first set of switches provides the first state the second set of switches provides the second state, and when the first set of switches provides the second state the second set of switches provides the first state.

18. The DAC element of claim 17, wherein the second set of switches in the first and second states do not contribute a direct current to the first and second outputs.

19. The DAC element of claim 15, wherein the switches of at least one of the first and second sets of switches include one of a NMOS switch, a PMOS switch, and a low voltage NMOS switch.

20. A method comprising:
receiving a digital input signal at an input;
switching each of a plurality of primary DAC elements between a first state and a second state based on the digital input signal to convert the digital input signal into an analog output signal;
outputting the analog output signal to an output; and
switching each of a plurality of corrective DAC elements between the first state and the second state such that a charge drawn from the output by parasitic capacitances of the main and corrective DAC elements is substantially constant,
wherein the plurality of primary DAC elements are provided in parallel to the plurality of corrective DAC elements between the input and output.

21. The method of claim 20, further comprising:
controlling the switching between the first state and the second state such that the total number of primary and corrective DAC elements transitioning between the first and second state is constant in each cycle.

22. The method of claim 20, wherein the switching of the corrective DAC elements does not contribute a direct current to the analog output signal.

23. The method of claim 20, wherein in the first state the primary DAC elements provide a positive current to the output, and in the second state the primary DAC elements provide a negative current to the output.

* * * * *